United States Patent [19]

Kojima et al.

[11] Patent Number: 5,340,977

[45] Date of Patent: Aug. 23, 1994

[54] SOLID-STATE IMAGE PICKUP DEVICE

[75] Inventors: Motohiro Kojima, Takatsuki; Takuya Watanabe, Mukou; Tohru Takamura, Takatsuki, all of Japan

[73] Assignee: Matsushita Electronics Corporation, Ltd., Osaka, Japan

[21] Appl. No.: 912,486

[22] Filed: Jul. 13, 1992

[30] Foreign Application Priority Data

Jul. 11, 1991 [JP] Japan .................. 3-170916
Feb. 24, 1992 [JP] Japan .................. 4-035978

[51] Int. Cl.$^5$ ............... H01J 40/14; H01L 29/78; H01L 27/14; H04N 9/07
[52] U.S. Cl. ................... 250/208.1; 257/222; 257/234; 257/241; 348/282; 348/283
[58] Field of Search ........ 257/234, 222, 241; 250/208.1; 358/41, 43, 44, 48, 213.23, 213.26, 213.29

[56] References Cited

U.S. PATENT DOCUMENTS

| | | | |
|---|---|---|---|
| 3,983,573 | 9/1976 | Ishihara | 257/234 |
| 4,482,909 | 11/1984 | Heald | 257/234 |
| 4,528,594 | 7/1985 | Kadekodi et al. | 257/234 |
| 5,105,264 | 4/1992 | Erhardt | 257/234 |

OTHER PUBLICATIONS

"6-line-space 5Kbit Color Linear Image Sensor", Kazuo Miwada et al., (NEC Corp. Application-Specific LSI Div.) ITEJ Technical Report, vol. 15, No. 16, pp. 19-22, Feb. 28, 1991.

"5Kbit x 3 (R,G,B) Color Line Sensor for Reduction Optical System", Tatsuhisa Fujii et al., Hitachi Review, vol. 72, No. 7, pp. 113-118 (1990).

Primary Examiner—Gene M. Munson
Attorney, Agent, or Firm—Ratner & Prestia

[57] ABSTRACT

A solid-state image pickup device, and in particular, a CCD image sensor is capable of color reading, wherein n lines (n≧2) of photo diodes disposing a plurality of photodiodes straightly are disposed parallel adjacently to each other, and adjacent n lines of CCD analog shift registers are disposed parallel to the photodiode lines at one side of the group of n lines of photodiodes, and the signal charges are transferred through a gate structure composed of MOS structure, between adjacent lines of n lines of photodiodes and n lines of CCD analog shift registers. It is therefore possible to reduce the intervals of the photodiode lines to the limit, thereby realizing a CCD color linear image sensor capable of outstandingly simplifying the signal time axis correction circuit such as semiconductor digital memory device for correcting the differences of reading positions of the photodiode lines.

5 Claims, 4 Drawing Sheets

SOLID-STATE IMAGE PICKUP DEVICE

BACKGROUND OF THE INVENTION

The present invention relates to a solid-state image pickup device, and more particularly to a CCD linear image sensor for color reading used in color copiers, color image scanners or the like.

Recently the demand for color representation is rapidly mounting in copiers, image scanners and other appliances, and CCD color linear image sensors playing an important role of reading images in these appliances are expected to be enhanced in performance.

Hitherto, the CCD color linear image sensor of this type generally had the structure as disclosed in the publication 5 k-bit ×3 (R, G, B) color line sensor for reduction optical system (Fujii, Kadowaki: Hitachi Review, Vol. 72, No. 7). This structure and the image reading method are explained below while referring to FIG. 5 and FIG. 6.

As shown in FIG. 5, the conventional CCD color linear image sensor comprised three CCD linear image sensors for reading red, green and blue colors disposed adjacently in a single chip, consisting of photodiode lines consisting of photodiode lines (11a, 12a, 13b, ..., 1na), (11b, 12b, 13b, ..., 1nb), (11c, 12c, 13c, ..., 1nc), shift gates 3a, 3b, 3c for signal charge transfer disposed parallel to these photodiode lines, CCD analog shift registers for signal charge transfer (21a, 22a, 23a, ... 2na), (21b, 22b, 23b, ... 2nb), (21c, 22c, 23c, ... 2nc), charge-voltage converters 4a, 4b, 4c, and output terminal 5a, 5b, 5c. The photodiode lines (11a, 12a, 13a, ... 1na), (11b, 12b, 13b, ... 1nb), (11c, 12c, 13c, ..., 1nc) are provided with color filters of, for example, red, green and blue, in every line for color separation.

The individual photodiodes for composing the photodiode lines (11a, 12a, 13a, ... 1na), (11b, 12b, 13b, ... 1nb), (11c, 12c, 13c, ... 1nc), are generated at pitches p, and the interval of photodiode lines (11a, 12a, 13a, ... 1na) and (11b, 12b, 13b, ... 1nb) is L1, and the interval of photodiode lines (11b, 12b, 13b, ... 1nb) and (11c, 12c, 13c, ... 1nc) is L2.

The photogenerated signal charges in the photodiode lines (11a, 12a, 13a, ..., 1na), (11b, 12b, 13b, ... 1nb), (11c, 12c, 13c, ..., 1nc) are transferred through shift gates 3a, 3b, 3c respectively to CCD analog shift registers (21a, 22a, 23a, ... 2na), (21b, 22b, 23b, ..., 2nb), (21c, 22c, 23c, ..., 2nc). The signal charges transferred to the CCD analog shift registers (21a, 22a, 23a, ..., 2na), (21b, 22b, 23b, ..., 2nb), (21c, 22c, 23c, ..., 2nc) are sequentially transferred to the charge-voltage converters 4a, 4b, 4c by applying clock pulses, and are produced from the output terminals 5a, 5b, 5c as voltage changes.

By the CCD color linear image sensor based on the prior art having the above constitution, the optical system for reading color images is composed approximately as shown in FIG. 6. The light reflected by a document 6 is reduced to 1/m through a lens 7, and is projected on three photodiode lines of the CCD color linear image sensor. In this case, since the interval of the photodiode lines (11a, 12a, 13a, ..., 1na) and (11b, 12b, 13b, ..., 1nb) is L1 and the interval of the photodiode lines (11b, 12b, 13b, ..., 1nb) and (11c, 12c, 13c, ..., 1nc) is L2, the information on the straight line at a distance of L1×m between the photodiode lines (11a, 12a, 13a, ..., 1na) and (11b, 12b, 13b, ..., 1nb) or at a distance of L2×m between the photodiode lines (11b, 12b, 13b, ..., 1nb) and (11c, 12c, 13c, ..., 1nc) is read on the document surface.

Supposing the document is moving at a specific speed v in the direction of the arrow in order to scan the whole document, with respect to the information on the same straight line on the document, the signal of the photodiode line (11c, 12c, 13c, ..., 1nc) is obtained prior to the signal of the photodiode line (11a, 12a, 13a, ..., 1na) by the time $T_c=(L1+L2)\times m \div v$, and the signal of the photodiode lines (11b, 12b, 13b, ..., 1nb), prior to the signal of the photodiode line (11a, 12a, 13a, ..., 1na) by the time $T_b=L1\times m \div v$.

In the CCD color linear image sensor conforming to such prior art, in order to obtain the color information on the same straight line on the document in signal processing, it is necessary to synthesize the signals of three photodiode lines by delaying the signal of the photodiode line (11c, 12c, 13c, ..., 1nc) and the signal of the photodiode line (11b, 12b, 13b, ..., 1nb) against the signal of the photodiode line (11a, 12a, 13a, ..., 1na) by the time $T_c$ and the time $T_b$, respectively.

Generally, to realize such signal delay time, for example, a semiconductor digital memory device is used. In the CCD color linear image sensor according to the prior art, the density of integration of CCD analog shift registers placed between the photodiode lines is limited, and it is very difficult to set the photodiode line intervals L1, L2 under 12p. Using a CCD color linear image sensor having 5,000 photodiodes each in photodiode lines with the photodiode line intervals L1, L2 defined as L1=L2=12p, the horizontal and vertical directions on the document are read at the same reading resolution. When the signals of three lines of photodiodes are digitalized into 8-bit information individually, the memory capacity necessary for the semiconductor digital memory device for delay necessary for time axis correction of photodiode lines is 5,000 bits×(12+24)×8=1,440,000 bits, that is, about 1.4 Mbits, and when using such a CCD colorlinear image sensor, the color copier or color image scanner may be notably increased in cost and complicated in circuit composition.

The invention is intended to solve such problems, and it is a primary object thereof to present a CCD linear image sensor capable of significantly simplifying the signal time axis correction circuit of a semiconductor digital memory device or the like.

SUMMARY OF THE INVENTION

A CCD linear image sensor includes n straight lines (n≧2) each line including a plurality of photodiodes. The lines are disposed parallel and adjacent to each other, and adjacent n lines of CCD analog shift registers disposed parallel to the photodiode lines at one side of the group of n lines of photodiodes. The signal charges are transferred through a gate structure composed of MOS structure, between adjacent lines within the n lines of photodiodes and n lines of CCD analog shift registers.

Furthermore, in the case of n=2, to form three color filters for color separation individually on three photodiodes having the same opening area, if the photodiode forming the first color filter has the highest sensitivity, the photodiode forming the second color filter has the next highest sensitivity, and the photodiode forming the third color filter has the lowest sensitivity, the first color filter is disposed on the photodiode line remote from the CCD analog shift register, and the second color filter is disposed on the photodiode line closer to the CCD analog shift register.

By thus composing, the interval of the photodiode lines may be reduced. By applying the invention in the CCD color linear image sensor, the sensitivity to each color of color separation is balanced in the best condition.

DETAILED DESCRIPTION OF THE INVENTION

An embodiment of the invention is described in detail herein by reference to FIGS. 1, 2, 3 and 4.

Figure 1:
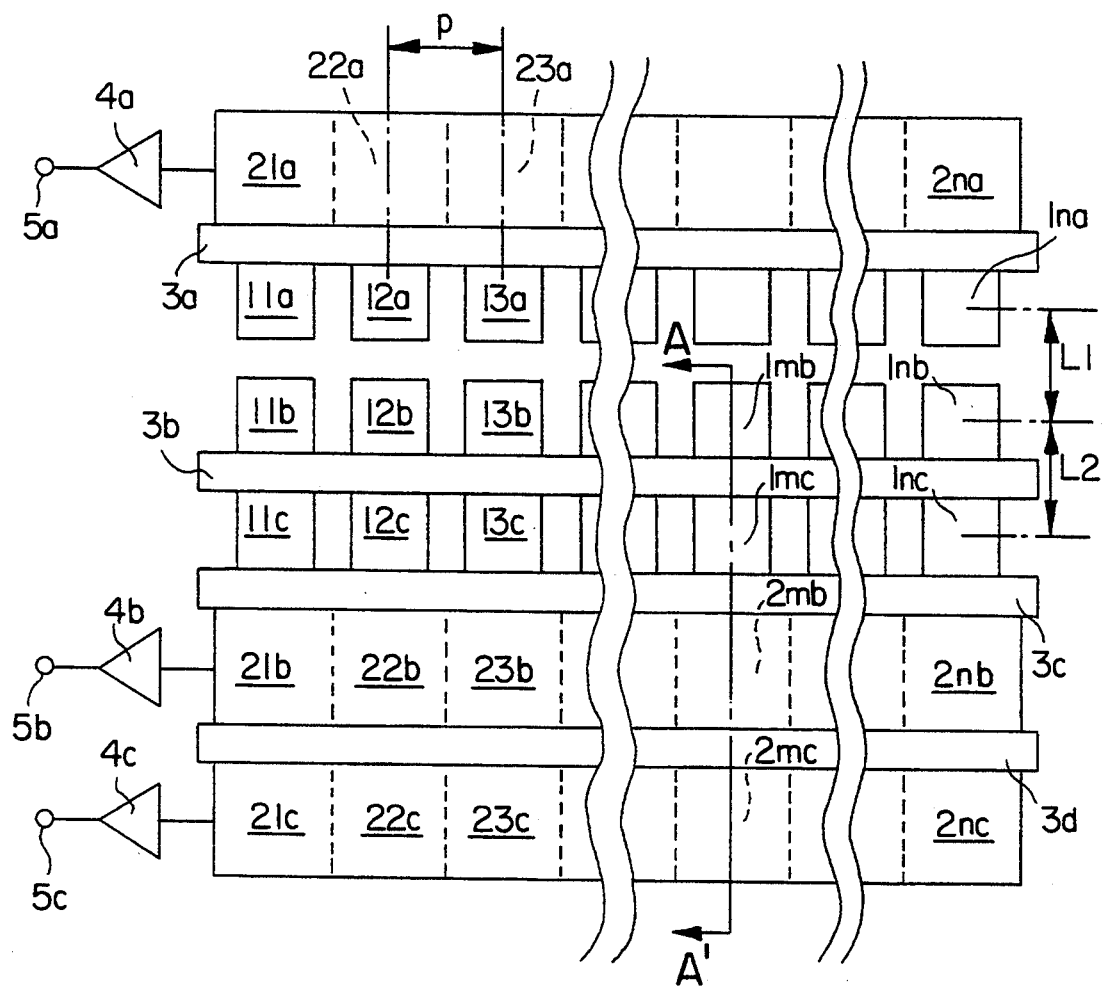
FIG. 1 shows a plane configuration and a circuit diagram of a CCD linear image sensor in an exemplary embodiment of the invention.
Figure 2:
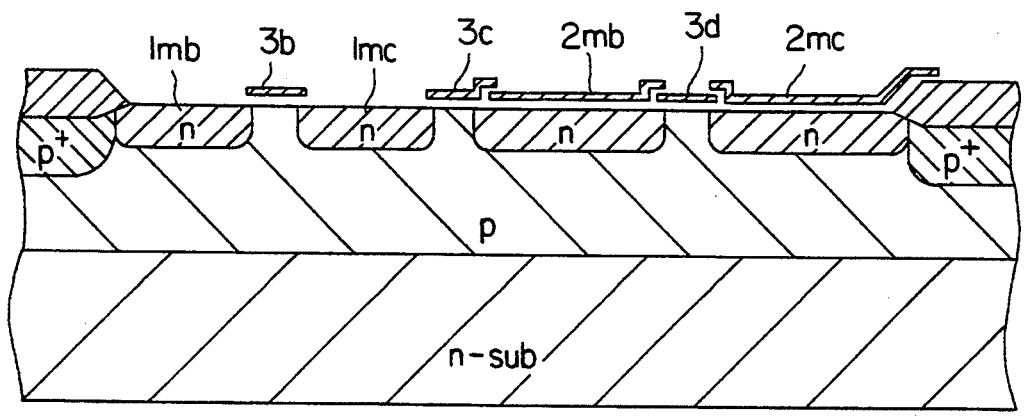
FIG. 2 is a sectional view along line A—A' of the CCD linear image sensor in FIG. 1.
Figure 3:
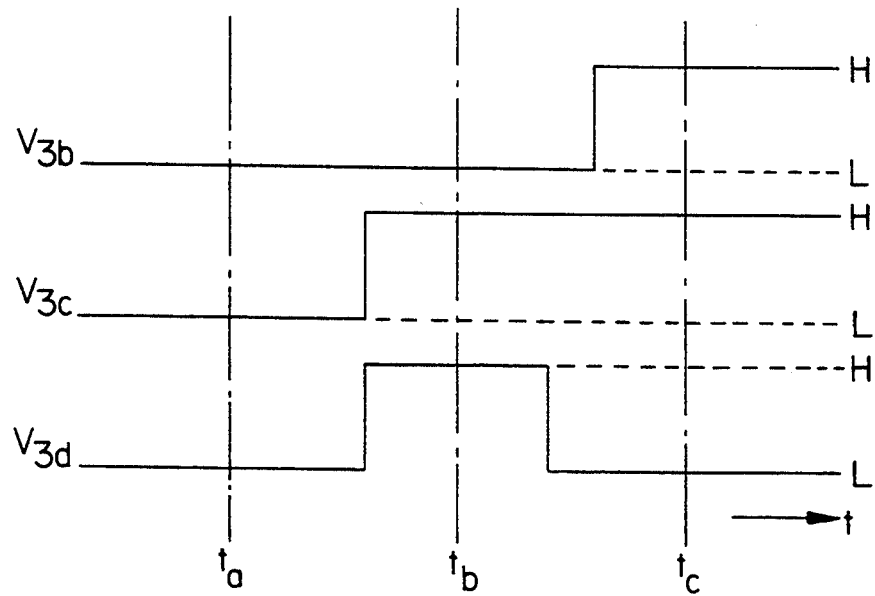
FIG. 3 is a timing diagram of the CCD linear image sensor in FIG. 1, FIG. 4a, 4b, 4c show potential profiles of signal charges at times $t_a$, $t_b$, $t_c$ respectively for the sensor shown in FIG. 2.
Figure 5:
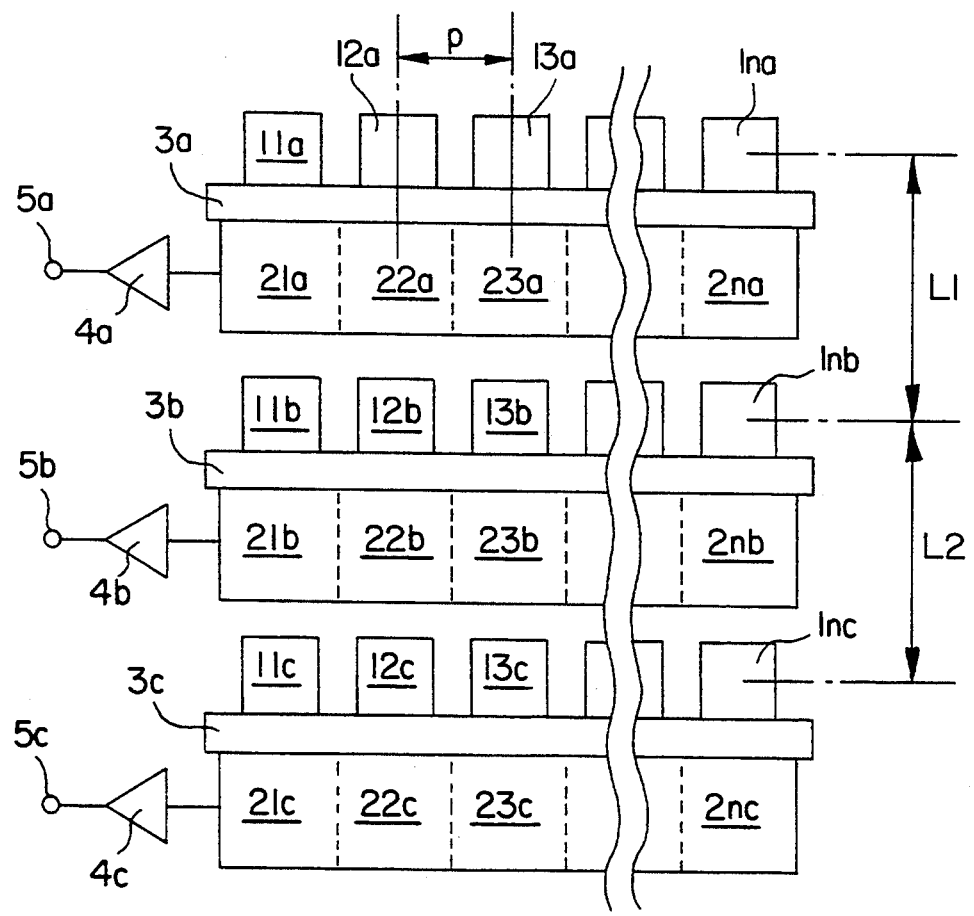
FIG. 5 shows a conventional CCD color linear image sensor.

FIG. 1 shows the plane configuration and circuit diagram of a CCD linear image sensor in an embodiment of the invention, FIG. 2 is a sectional view along line A—A' of the CCD linear image sensor in FIG. 1, FIG. 3 is an example of drive pulse timing of the CCD linear image sensor in FIG. 1, and FIG. 4A, 4B, and 4C are potential profiles of signal charges in three states at times $t_a$, $t_b$, $t_c$ of drive pulses in FIG. 3 corresponding to the sectional view in FIG. 2.

In FIG. 1, (11a, 12a, 13a, ..., 1na), (11b, 12b, 13b, ..., 1mb, ..., 1nb), (11c, 12c, 13c, ..., 1mc, ..., 1nc) are photodiode lines, and for use in color image reading, they are respectively provided with color filters for color separation of, for example, green, blue and red colors. The individual photodiodes composing each photodiode line are arranged at pitches p in the laying direction, and the intervals of the photodiode lines (11a, 12a, 13a, ..., 1na) and (11b, 12b, 13b, ..., 1mb, ..., 1nb), and the photodiode lines (11b, 12b, 13b, ..., 1mb, ..., 1nb) and (11c, 12c, 13c, ..., 1mc, ... 1nc) are respectively supposed to be L1 and L2. (21a, 22a, 23a, ..., 2na), (21b, 22b, 23b, ..., 2mb, ..., 2nb), (21c, 22c, 23c, ..., 2mc, ..., 2nc) are CCD analog shift registers for signal charge transfer respectively corresponding to the photodiode lines (11a, 12a, 13a, ..., 1na), (11b, 12b, 13b, ..., 1mb, ..., 1nb), (11c, 12c, 13c, ..., 1mc, ..., 1nc). 3a, 3b, 3c, and 3d are shift gates for respectively transferring signal charges from the photodiode line (11a, 12a, 13a, ..., 1na) to the CCD analog shift register (21a, 22a, 23a, ..., 2na), from the photodiode line (11b, 12b, 13b, ..., 1mb, ..., 1nb) to the photodiode line (11c, 12c, 13c, ..., 1mc, ..., 1nc), from the photodiode line (11c, 12c, 13c, ..., 1mc, ..., 1nc) to the CCD analog shift register (21b, 22b, 23b, ..., 2mb, ..., 2nb), and from the CCD analog shift register (21b, 22b, 23b, ..., 2mb, ..., 2nb) to the CCD analog shift register (21c, 22c, 23c, ..., 2mc, ..., 2nc). At the end of the CCD analog shift registers, charge-voltage converters 4a, 4b, 4c, and output terminals 5a, 5b, 5c are disposed.

In FIG. 1, the photodiode line (11a, 12a, 13a, ..., 1na), the CCD analog shift resistor (21a, 22a, 23a, ..., 2na), the shift gate 3a, the charge-voltage converter 4a, and the output terminal 5a relates to the CCD linear image sensor of a general composition according to the prior art, and the photodiode lines (11b, 12b, 13b, ..., 1mb, ..., 1nb), (11c, 12c, 13c, ..., 1mc, ..., 1nc), the CCD analog shift registers (21b, 22b, 23b, ..., 2mb, ..., 2nb), (21c, 22c, 23c, ..., 2mc, ..., 2nc), and the shift gates 3b, 3c, 3d relate to the present invention.

Figure 4A:
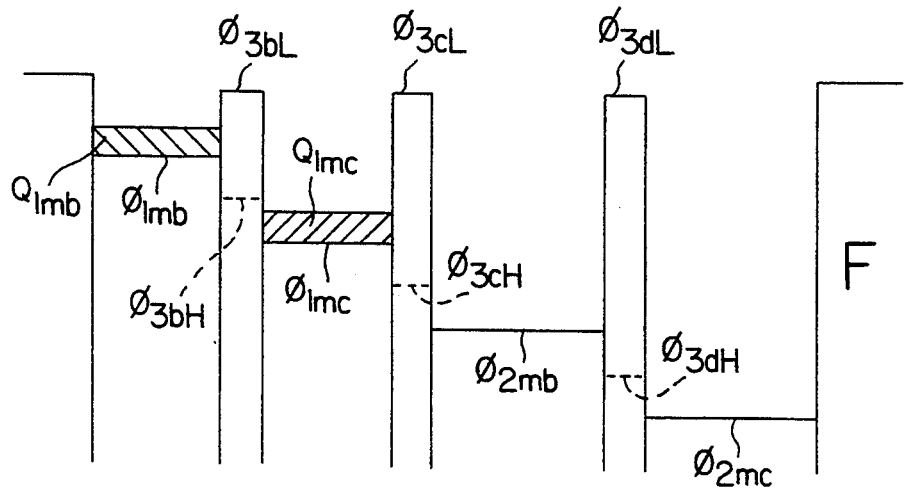
Figure 4B:
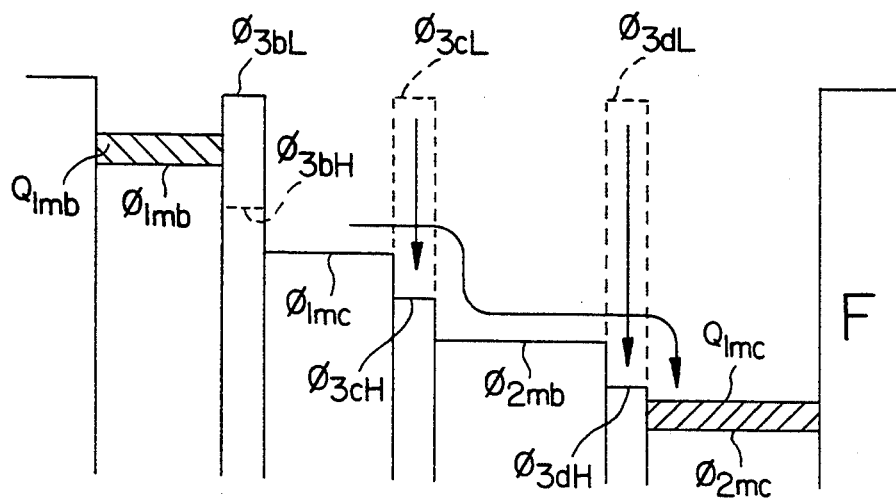
Figure 4C:
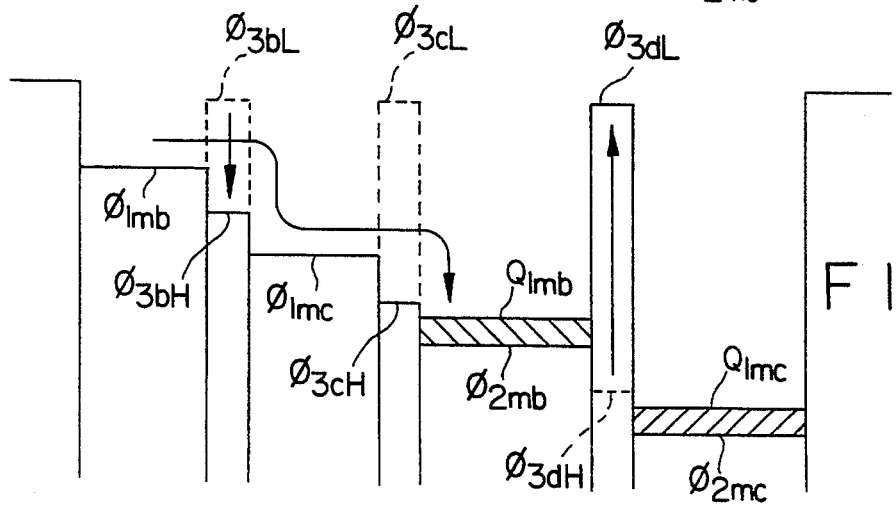
Figure 6:
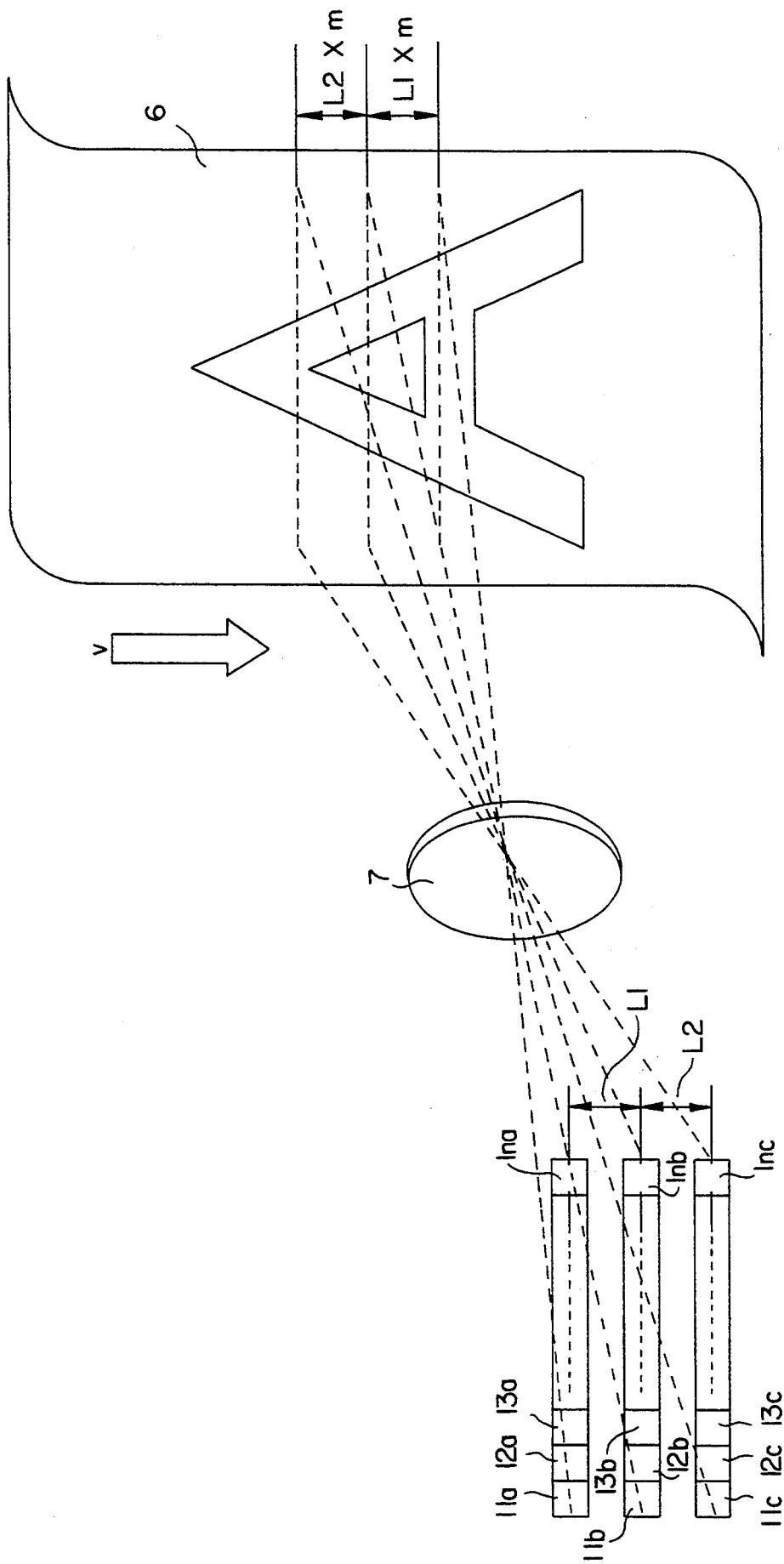
FIG. 6 is a schematic diagram showing an optical system for reading images using sensor shown in FIG. 5.

In FIG. 3, $V_{3b}$, $V_{3c}$, $V_{3d}$ are pulse voltages applied to the shift gates 3b, 3c, 3d in FIG. 1 and FIG. 2. In FIG. 4, $\phi_{3bL}$, $\phi_{3cL}$, $\phi_{3dL}$ represent the potentials of the shift gates 3b, 3c, 3d corresponding to the low level of $V_{3b}$, $V_{3c}$, $V_{3d}$, respectively, and $\phi_{3bH}$, $\phi_{3cH}$, $\phi_{3dH}$ denote the potentials of the shift gates 3b, 3c, 3d corresponding to the high level of $V_{3b}$, $V_{3c}$, $V_{3d}$, respectively. $\phi_{3bL}$, $\phi_{3cL}$, $\phi_{3dL}$ are so set as to be sufficient barriers for the signal charges. $\phi_{1mb}$, $\phi_{1mc}$ are initial potentials of photodiodes 1mb, 1mc in the absence of photo signal charge, and $\phi_{2mb}$, $\phi_{2mc}$ are potentials of the bottom of the potential wells of the transfer gates 2mb, 2mc of the CCD analog shift register. In FIGS. 4A–4C lower position within each diagram indicates lower signal charge potential. In the period relating to the transfer operation of the electric charge, by applying a proper voltage in 2mb, 2mc, it is set to satisfy the relation so that $\phi_{2mc}$ may be lower than $\phi_{2mb}$.

At time $t_a$, all of $V_{3b}$, $V_{3c}$, $V_{3d}$ are set at low level, and as shown in FIG. 4A, the potentials of the shift gates 3b, 3c, 3d are sufficiently high barriers for the signal charge. Accordingly, the signal charges $Q_{1mb}$, $Q_{1mc}$ generated by the light irradiated into the photodiodes 1mb, 1mc are accumulated in each of the photodiodes.

At time $t_b$, while keeping $V_{3b}$ at the low level, $V_{3c}$ $V_{3d}$ are turned to the high level. As a result, the potentials of the shift gates 3c, 3d become low, and the signal charge $Q_{1mc}$ accumulated in the photodiode 1mc closer to the CCD analog shift register is shifted to the CCD analog shift register 2mc.

In the period from time $t_b$ to time $t_c$, $V_{3d}$ is returned to the low level, then $V_{3b}$ is set at the high level. Consequently, at time $t_c$, the potential of the shift gates 3b, 3c is turned low, and the potential of 3d becomes a sufficiently high barrier for the signal charge. As a result, the signal charge $Q_{1mb}$ accumulated in the photodiode 1mb more remote from the CCD analog shift register moves to the CCD analog shift register 2mb.

By this series of actions, the signal charges $Q_{1mb}$, $Q_{1mc}$ accumulated in the photodiodes 1mb, 1mc can be independently transferred to the CCD analog shift registers 2mb, 2mc. Afterwards, returning $V_{3b}$, $V_{3c}$ to the low level, proper pulse voltages are applied to the transfer gates of the CCD analog shift registers (21b, 22b, 23b, ..., 2mb, ..., 2nb), (21c, 22c, 23c, ..., 2mc, ..., 2nc), and the signal charges are transferred in the direction of the charge-voltage converters 4b, 4c, thereby reading out the signal charges from the photodiodes. To transfer the electric charge smoothly from the photodiodes to the CCD analog shift registers, it is important to set potentials of the photodiodes and the CCD shift registers so as to decrease in sequence from $\phi_{1mb}$ (highest), to $\phi_{1mc}$, to $\phi_{2mb}$, to $\phi_{2mc}$ (lowest).

Thus, according to the constitution of the embodiment of the invention, it is possible to reduce the intervals L1, L2 of the photodiode lines to be nearly equal to the pitch p in the laying direction, and the signal time axis correction circuit for correcting the deviation of reading position of photodiode lines may be notably simplified.

Incidentally, in the embodiment of the invention shown in FIG. 1, because of the presence of the shift gate 3b, the opening area of photodiode lines generally becomes smaller in the sequence of (11a, 12a, 13a, ..., 1na), (11c, 12c, 13c, ..., 1mc, ..., 1nc), (11b, 12b, 13b, ..., 1mb, ..., 1nb). If these photodiode lines are provided with color filters for color separation of, for example, red, green and blue, to from three color filters individually on the three photodiodes of the same opening area, in the case of composing by using the color filters having such a spectral transmittance and photodiodes with such a spectral sensitivity that the photodiode forming the red color filter has the highest sensitivity, that the photodiode forming the green color filter has the second highest sensitivity, and that the photodiode forming the blue color filter has the lowest sensitivity, the blue color filter should be formed on the photodiode line (11a, 12a, 13a, ..., 1na), the red color filter on the photodiode line (11b, 12b, 13b, ..., 1mb, ..., 1nb), and the green color filter on the photodiode line (11c, 12c, 13c, ..., 1mc, ..., 1nc). Thus, the sensitivities of red, green and blue are balanced easily.

The invention is not limited, meanwhile, to this embodiment alone, and, needless to say, various modifications are possible. For example instead of the composition consisting of two lines each of the photodiode lines and CCD analog registers, if three or more lines are present, by properly setting the potentials of the photodiodes, CCD analog shift registers and shift gates, the electric charge may be transferred to the CCD analog shift registers corresponding to the photodiode lines. The color filters added for color separation are not limited to the combination of red, green and blue. The embodiment is a CCD color linear image sensor, but if used as a monochromatic sensor, the invention may be applied for the purpose of enhancing the S/N ratio by adding the signals of the photodiodes by correcting the delay time.

Thus, in the CCD linear image sensor of the invention, n lines (n≧2) of photodiodes each line including a plurality of photodiodes disposed in a straight line are disposed parallel adjacent to each other. Adjacent n lines of CCD analog shift registers are disposed parallel to the photodiode lines at one side of the group of n lines of photodiodes. The signal charges are transferred through a gate structure composed of MOS structure, between adjacent lines of the n lines of photodiodes and the n lines of CCD analog shift registers. Therefore the intervals of the photodiode lines may be reduced to the limit, thereby presenting a CCD color linear image sensor which can notably simplify the signal time axis correction circuit such as the semiconductor digital memory device for correcting reading position difference of photodiode lines.

Moreover, in the case of n=2, to form three color filters for color separation individually on three photodiodes having the same opening area, if the photodiode forming the first color filter has the highest sensitivity, the photodiode forming the second color filter has the next highest sensitivity, and the photodiode forming the third color filter has the lowest sensitivity, the first color filter is formed on the photodiode line remote from the CCD analog shift register, and the second color filter is formed on the photodiode line closer to the CCD analog shift register, thereby presenting a CCD color linear image sensor capable of balancing the sensitivity of colors in color separation in the best state.

We claim:

1. A solid-state image pickup device comprising:
   a plurality of straight lines of photodiodes including n lines, each line including a plurality of photodiodes, said lines disposed parallel and adjacent to each other;
   n lines of CCD analog shift registers disposed adjacent and parallel to the photodiode lines at one side of the group of n lines of said photodiodes;
   and a gate of MOS structure, between adjacent lines of the n lines of photodiodes and the n lines of CCD analog shift registers, through which the signal charges are transferred.

2. A solid-state image pickup device in accordance with claim 1, wherein an initial potential in the absence of a photo signal charge is lower in the photodiode line closer to the CCD analog shift register.

3. A solid-state image pickup device in accordance with claim 1, wherein a potential in the bottom of a potential well is lower in the one of said plurality of CCD analog shift register lines most remote from the photodiode line.

4. A solid-state image pickup device in accordance with claim 1, wherein all of the photodiodes are set in a depletion state immediately after reading out the signal charge of the photodiode.

5. A solid state image pickup device in accordance with claim 1, in which:
   the value of n is equal to 2;
   said plurality of photodiode lines includes first and second photodiode lines, said second photodiode line disposed between said first photodiode line and said CCD analog shift register; and
   said plurality of photodiodes includes:
   a first photodiode which has an opening area and forms a first color filter having a first sensitivity, said first color filter disposed on said first photodiode line;
   a second photodiode which has an open area equal to said first photodiode opening area and forms a second color filter with a second sensitivity lower than said first sensitivity, said second color filter disposed on said second photodiode line; and
   a third photodiode which has an open area equal to said first photodiode opening area and forms a third color filter with a third sensitivity lower than said second sensitivity.

* * * * *